United States Patent
Yang et al.

(10) Patent No.: US 8,288,780 B2
(45) Date of Patent: Oct. 16, 2012

(54) ORGANIC LIGHT EMITTING DISPLAY DEVICE

(75) Inventors: Nam-Choul Yang, Suwon-si (KR); Byoung-Deog Choi, Suwon-si (KR); Ki-Ju Im, Suwon-si (KR); Do-Youb Kim, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 345 days.

(21) Appl. No.: 12/588,802

(22) Filed: Oct. 28, 2009

(65) Prior Publication Data

US 2010/0102301 A1 Apr. 29, 2010

(30) Foreign Application Priority Data

Oct. 29, 2008 (KR) .................... 10-2008-0106358

(51) Int. Cl.
- H01L 27/15 (2006.01)
- H01L 29/161 (2006.01)
- H01L 31/12 (2006.01)
- H01L 31/153 (2006.01)
- H01L 33/00 (2010.01)
- H01L 51/00 (2006.01)

(52) U.S. Cl. ............. 257/84; 257/40; 257/80; 257/83; 257/233; 257/257; 257/290; 257/291; 257/292; 257/444; 257/462; 257/51.018; 257/E33.076; 313/506

(58) Field of Classification Search ............ 257/444, 257/462, E33.076, E51.018, 40, 80, 83, 233, 257/257, 290–292; 313/506
See application file for complete search history.

(56) References Cited

U.S. PATENT DOCUMENTS

| 6,940,566 | B1 | 9/2005 | Rho et al. |
| 8,044,580 | B2* | 10/2011 | Yamazaki et al. ........... 313/506 |
| 2005/0199876 | A1* | 9/2005 | Matsumoto .................... 257/64 |
| 2005/0258744 | A1* | 11/2005 | Kwak et al. .................. 313/504 |
| 2006/0082295 | A1* | 4/2006 | Chin et al. ................... 313/506 |
| 2006/0180890 | A1 | 8/2006 | Naugler, Jr. et al. |
| 2007/0126352 | A1* | 6/2007 | Okutani ........................ 313/506 |

(Continued)

FOREIGN PATENT DOCUMENTS

KR 10-2007-0026975 3/2007

(Continued)

OTHER PUBLICATIONS

Korean Office Action dated Dec. 29, 2009, corresponding to Korean Priority Application No. 10-2008-0106358.
Korean Office Action dated May 31, 2010 for the corresponding Korean Priority Application No. 10-2008-01063538.

*Primary Examiner* — Cheung Lee
*Assistant Examiner* — Jeremy Joy
(74) *Attorney, Agent, or Firm* — Robert E. Bushnell, Esq.

(57) ABSTRACT

An organic light emitting display device. The organic light emitting display device includes a substrate having a pixel region in which pixels are formed and a non-pixel region in which a light sensor is formed, an insulating film formed on the substrate, a first electrode formed on the insulating film and formed of a reflective material reflecting light, the first electrode being formed on the entire surface of the insulating film except for a region between the pixels and a region over the light sensor, a pixel defining film exposing a region of the first electrode and formed on the insulating film, an organic light emitting layer formed on the exposed region of the first electrode, and a second electrode formed on the organic light emitting layer. The first electrode is formed to have a greater area than that of the organic light emitting layer.

7 Claims, 1 Drawing Sheet

U.S. PATENT DOCUMENTS

| | | | |
|---|---|---|---|
| 2007/0205420 A1* | 9/2007 | Ponjee et al. | 257/80 |
| 2007/0257250 A1 | 11/2007 | Tseng et al. | |
| 2007/0262299 A1* | 11/2007 | Kho et al. | 257/40 |
| 2008/0084374 A1* | 4/2008 | Abileah et al. | 345/87 |

FOREIGN PATENT DOCUMENTS

| | | |
|---|---|---|
| KR | 100776498 B1 | 11/2007 |
| KR | 100840098 B1 | 6/2008 |

* cited by examiner

ORGANIC LIGHT EMITTING DISPLAY DEVICE

CLAIM OF PRIORITY

This application makes reference to, incorporates into this specification the entire contents of, and claims all benefits all benefits accruing under 35 U.S.C. §119 from an application earlier filed in the Korean Intellectual Property Office on Oct. 29, 2008, and there duly assigned Serial No. 10-2008-0106358.

BACKGROUND OF THE INVENTION

1. Field of the Invention

The present invention relates to an organic light emitting display device, and more particularly to an organic light emitting display device having pixels of which operation reliability is secured by incident light.

2. Description of the Related Art

Recently, various flat panel display devices having reduced weight and volume as compared with cathode ray tube display devices, have been developed. Among others, an organic light emitting display device using organic compounds as light emitting materials has excellent brightness and color purity. As a result, the organic light emitting display device has been spotlighted as a next generation display device. Further, the organic light emitting display device is thin and light and is also able to be driven by using a relatively low power so that the organic light emitting display device has been expected to be useful in a portable display device or the like.

The portable display device is exposed to various external circumstances so that the visibility of a video image displayed by the portable display device may vary according to the various external circumstances, in particular, according to the external light illumination. In order to prevent this, there has been contrived a method to sense the intensity of the external light by having a light sensor disposed inside the portable display device and thus to control the brightness of a pixel unit.

Therefore, the organic light emitting display device used as a portable display device has a pixel unit allowing the brightness thereof to be controlled by the intensity of the external light. The pixel unit includes a pixel circuit having a transistor on a substrate and an organic light emitting diode receiving an electric current from the pixel circuit to emit light. A light sensor is formed in a region where the pixel circuit and the organic light emitting diode are not formed.

In the organic light emitting display device constructed as above, if an internal light, that is, the light generated by the organic light emitting diode, shines upon the pixel circuit, an electrical current may be undesirably generated by the internal light in the transistor or the like, and mal-function may occur.

SUMMARY OF THE INVENTION

It is therefore an object of the present invention to provide an improved organic light emitting display device.

It is another object to solve the above problems by providing an organic light emitting display device having pixels of which operation is stabilized by preventing the deterioration of operation reliability by incident light.

In order to accomplish the above object, according to a first aspect of the present invention, there is provided an organic light-emitting display device constructed with a substrate having a pixel region in which pixels are formed and a non-pixel region in which a light sensor is formed, an insulating film formed on the substrate, a first electrode formed of a reflective material reflecting light and disposed on the entire surface of the insulating film except for a region between the pixels and except for a region over the light sensor, a pixel defining film exposing a region of the first electrode and formed on the insulating film, an organic light emitting layer formed on the exposed region of the first electrode, and a second electrode formed on the organic light emitting layer. The area of the first electrode is formed to be larger than that of the organic light emitting layer.

Additionally, the insulating film of the organic light emitting display device may include a first planarization film that is an inorganic insulating film and a second planarization film that is an organic insulating film.

Additionally, the organic light emitting display device may further include a black matrix formed between the first planarization film and the second planarization film and exposing the light sensor.

Also, additionally, the first electrode may be formed of a material including Al or Ag.

Also, additionally, the black matrix is formed in a stacked structure including chrome and chrome oxide.

Also, additionally, the black matrix is formed in a stacked structure including molybdenum and molybdenum oxide.

With the present invention, external light incident to the organic light emitting display device and light generated from the light emitting layer are reflected so not to enter an element such as the TFT or the like to secure the operation reliability, making it possible to stabilize the operation of a pixel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
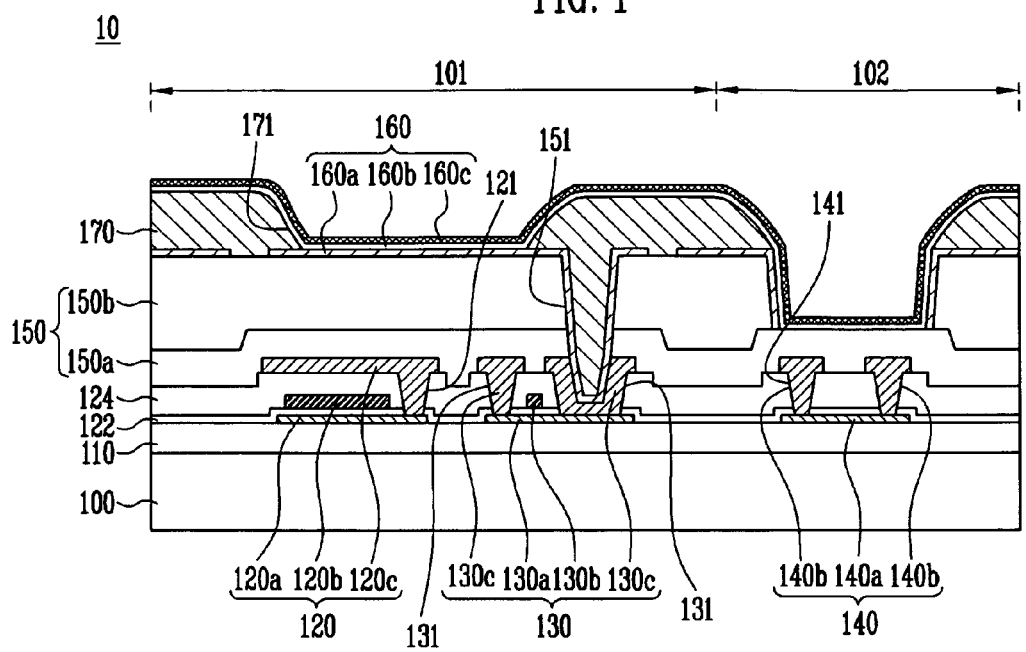
FIG. 1 is a cross-sectional view of an organic light-emitting display device constructed as a first embodiment according to the principles of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, that element can be directly on the another element or be indirectly on the another element with one or more intervening elements interposed therebetween. Also, when an element is referred to as being "connected to" another element, the element can be directly connected to the another element or be indirectly connected to the another element with one or more intervening elements interposed therebetween. Hereinafter, like reference numerals refer to like elements.

FIG. 1 is a cross-sectional view of an organic light-emitting display device constructed as a first embodiment according to the principles of the present invention. Referring to FIG. 1, a substrate 100 of organic light emitting display device 10 includes a pixel region 101 in which pixels are formed and a non-pixel region 102. More specifically, pixel region 101 includes a capacitor 120 and a thin film transistor (TFT) 130 that are driving devices and that are formed on a buffer layer 110 on substrate 100, an insulating film 150 formed on capacitor 120 and TFT 130, and an organic light emitting diode 160 formed on insulating film 150 and electrically connected to TFT 130 through a via-hole 151 formed on insulating film 150. Non-pixel region 102 includes a light sensor 140 formed of photo diodes.

Herein, capacitor 120 is formed in a dual structure. Capacitor 120 includes a semiconductor layer 120a, a gate metal 120b and a source/drain metal 120c. Semiconductor layer 120a is formed on buffer layer 110, and gate metal 120b is formed to overlap semiconductor layer 120a, with a gate insulating film 122 being interposed therebetween. Source/drain metal 120c is formed to overlap gate metal 120b, with an interlayer insulating film 124 being interposed therebetween, and is electrically connected to semiconductor layer 120a through a contact hole 121. Semiconductor layer 120a of capacitor 120 may be formed simultaneously during the process of forming both a semiconductor layer 130a of TFT 130 and a semiconductor layer 140a of light sensor 140. Gate metal 120b and source/drain metal 120c of capacitor 120 may be formed simultaneously during the processes of forming both a gate metal 130b and a source/drain metal 130c of TFT 130 and forming a source/drain metal 140b of light sensor 140.

TFT 130 includes a semiconductor layer 130a, a gate metal 130b and a source/drain metal 130c. Semiconductor layer 130a is formed on buffer layer 110, and gate metal 130b is formed on semiconductor layer 130a, with gate insulating film 122 being interposed therebetween. Source/drain metal 130c is formed on gate metal 130b having interlayer insulating film 124 therebetween and is electrically connected to semiconductor layer 130a through a contact hole 131.

Light sensor 140 includes a semiconductor layer 140a and a source/drain metal 140b. Source/drain metal 140b is electrically connected to semiconductor layer 140a through a contact hole 141 having both of gate insulating film 122 and interlayer insulating film 124 disposed therebetween.

Insulating film 150 is formed on capacitor 120, TFT 130 and light sensor 140. Insulating film 150 may be formed in a multilayer structure including organic and inorganic insulating films. For example, insulating film 150 may include a first planarization film 150a which is an inorganic insulating film, and a second planarization film 150b which is an organic insulating film 150b.

A first electrode (for example, an anode electrode) 160a of organic light emitting diode 160 is electrically connected to thin film transistor 130 through via-hole formed 151 formed on insulating film 150, and is formed on the top of insulating film 150. First electrode 160a of organic light emitting diode 160 is formed of metal such as Al or Ag to reflect light. First electrode 160a of organic light emitting diode 160 is formed to have an area that is larger than that of a light emitting layer 160b of organic light emitting diode 160. Accordingly, the light generated from light emitting layer 160b of organic light emitting diode 160 is reflected by first electrode 160a of organic light emitting diode 160, so that the light will not enter TFT 130 or the like. The light generated from light emitting layer 160b of organic light emitting diode 160 does not enter light sensor 140, either.

Owing to the reasons described above, the operation reliability of an element sensitive to light such as TFT 130 is secured, making it possible to stabilize the operation of the corresponding pixel. Only external light enters light sensor 140, making it possible to precisely measure the intensity of the external light.

Organic light emitting layer 160b of organic light emitting diode 160 is formed on an exposed region of first electrode 160a and a pixel defining layer 170. That is, pixel defining layer 170 is formed on first electrode 160a and is formed with an opening 171 to expose a region of first electrode 160a, and organic light emitting layer 160b of organic light emitting diode 160 is formed on the exposed region of first electrode 160a. Organic light emitting layer 160b may include various layers according to their functions. Organic light emitting layer 160b is generally formed in a multilayer structure including at least one of a hole injection layer (HIL), a hole transporting layer (HTL), a hole blocking layer (HBL), an electron transporting layer (ETL) and an electron injection layer (EIL), in addition to the light emitting layer. And the area of first electrode 160a is formed to be larger than the area of light emitting layer 160b of organic light emitting diode 160, excepting the hole injection layer (HIL), the hole transporting layer (HTL), the hole blocking layer (HBL), the electron transporting layer (ETL) and the electron injection layer (EIL).

A second electrode (for example, a cathode electrode) 160c of the organic light emitting diode is formed across the entire substrate including organic light emitting layer 160b and first electrode 160a.

Figure 2:
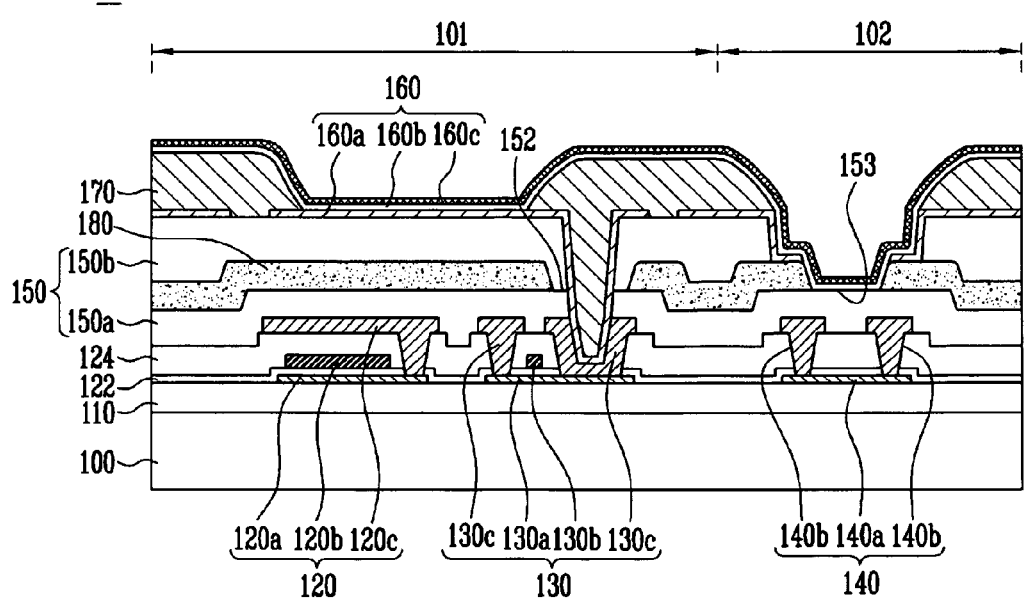
FIG. 2 is a cross-sectional view of an organic light-emitting display device constructed as a second embodiment according to the principles of the present invention.

FIG. 2 is a cross-sectional view of an organic light-emitting display device constructed as a second embodiment according to the principles of the present invention. When describing FIG. 2, the same constituents as shown in FIG. 1 will have the same reference numerals and the detailed description thereof will be omitted.

Referring to FIG. 2, a black matrix 180 is further included in the organic light emitting display device of FIG. 1. Black matrix 180 is formed between first planarization film 150a that is an inorganic insulating film and second planarization film 150b that is an organic insulating film.

More specifically, black matrix 180 is formed on first planarization film 150a, wherein black matrix 180 is not formed on region 152 where first electrode 160a of organic light emitting diode 160 and source/drain metal 130c of TFT 130 are electrically connected and region 153 where the external light is incident on light sensor 140.

As described above, black matrix 180 is formed to cover driving devices 120 and 130 to block the external light from being reflected by driving devices 120 and 130, thus making it possible to efficiently prevent deterioration of a contrast of the video image displayed by organic light emitting display device 20. Also, in this case, not only the external light but also the light generated from organic light emitting layer 160 does not reach driving devices 120 and 130. Therefore, the external light and the light generated from organic light emitting layer 160b is blocked by first electrode 160a of organic light emitting diode 160 primarily, and by black matrix 180 secondarily, thus making it possible to block light more efficiently. Accordingly, the operation reliability of the element which is sensitive to light, such as TFT 130, is secured, thus making it possible to stabilize the operation of the pixel. Black matrix 180 is configured to have a stacked structure of chrome/chrome or a stacked structure of molybdenum/molybdenum.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
a substrate having a pixel region in which pixels are formed and a non-pixel region in which a light sensor is formed;
an insulating film formed on the substrate;
a first electrode formed on the insulating film and formed of a reflective material reflecting light, the first electrode being formed on the entire surface of the insulating film except for a region between the pixels and a region over the light sensor;
a pixel defining film exposing a region of the first electrode and formed on the insulating film;
an organic light emitting layer formed on the exposed region of the first electrode; and
a second electrode formed on the organic light emitting layer, with the first electrode having a greater area than that of the organic light emitting layer.

2. The organic light emitting display device according to claim 1, wherein the insulating film comprises a first planarization film that is an inorganic insulating film and a second planarization film that is an organic insulating film.

3. The organic light emitting display device according to claim 2, further comprising:
a black matrix formed between the first planarization film and the second planarization film and exposing the light sensor.

4. The organic light emitting display device according to claim 1, wherein the first electrode is formed of a material selected from a group of Al and Ag.

5. The organic light emitting display device according to claim 3, wherein the black matrix is formed in a stacked structure comprising chrome and chrome oxide.

6. The organic light emitting display device according to claim 3, wherein the black matrix is formed in a stacked structure comprising molybdenum and molybdenum oxide.

7. An organic light emitting display device, comprising:
a substrate having a pixel region in which pixels are formed and a non-pixel region in which a light sensor is formed;
an insulating film formed on the substrate;
a first electrode formed on the insulating film and formed of a reflective material reflecting light, the first electrode being formed on the entire surface of the insulating film except for a region between pixels and a region over the light sensor;
a pixel defining film exposing a region of the first electrode and formed on the insulating film;
an organic light emitting layer formed on the exposed region of the first electrode, with the first electrode having a greater area than that of the organic light emitting layer;
a second electrode formed on the organic light emitting layer; and
a black matrix formed between the first planarization film and the second planarization film and exposing the light sensor.

* * * * *